United States Patent [19]

Larimer

[11] Patent Number: 5,664,158

[45] Date of Patent: Sep. 2, 1997

[54] VIDEO DISPLAY ENGINEERING AND OPTIMIZATION SYSTEM

[75] Inventor: James Larimer, Montara, Calif.

[73] Assignee: The United States of America as represented by the Administrator of the National Aeronautics and Space Administration, Washington, D.C.

[21] Appl. No.: 414,652

[22] Filed: Apr. 25, 1995

[51] Int. Cl.$^6$ .................................................. G06F 17/00
[52] U.S. Cl. ............................................. 395/500; 345/10
[58] Field of Search ...................... 395/500, 358, 395/535, 518, 131; 345/10, 904, 180, 181, 182, 183, 184, 185, 127, 147; 355/327; 358/518; 348/403

[56] References Cited

U.S. PATENT DOCUMENTS

| | | | |
|---|---|---|---|
| 4,658,246 | 4/1987 | Kuperman | 340/723 |
| 4,884,130 | 11/1989 | Huntsman | 358/80 |
| 4,949,135 | 8/1990 | Ng | 355/327 |
| 5,070,413 | 12/1991 | Sullivan et al. | 358/456 |
| 5,172,227 | 12/1992 | Tsai et al. | 358/133 |
| 5,298,892 | 3/1994 | Shapiro et al. | 340/784 |

OTHER PUBLICATIONS

Jordan et al., Resonant Fluorescent Lamp Converter Provides Efficient and Compact Solution, IEEE, pp. 424–431 Mar. 7, 1993.

Maximus et al., Model for Ion Transport in AM–LCD's, IEEE, pp. 53–56 Oct. 15, 1991.

Ong, LCDs Modeling by 2×2 and 4∴4 Propagation Matrix Methods and by Generalized Geometrical Optics Approximation, IEEE, pp. 73–76 Oct. 15, 1991.

M. Shur, Circuit models and parameter extraction technique for poly–Si Thin Film Transistors, Proc. 1993 Intl. Semiconductor Device Res. Symp., Charlottesville, VA, 1, 165–168 1993.

M. Shur, Physics of semiconductor devices, Prentice–Hall: NJ 1990.

D.W. Berreman, Numerical modeling of twisted nematic devices, Phil. Trans. R. Soc. Lond. A 309, 203–216 1983.

D.W. Berreman, Reflection and transmission by single–domain cholestric liquid crystal films: theory and verification, Mol. Crystals and Liquid Crystals, 11, 395–405 1970.

R. Samandani, Color tilings for flat panel displays, SID'93 Digest, 893–86 1993.

F.W. Campbell, Optical quality of the human eye, J. Physiol. (Lond.), 186, 558–578 1966.

H.R. Wilson, A four mechanism model for threshold spatial vision. Vis. Res., 19, 19–32 1979.

J. Larimer, Proceedings of the SPIE, 1456, 196–210 1991.

J. Lubin, Cockpit display visibility modeling, NASA Contractor Report 1777623 1993.

J. Lubin, The use of psycho–physical data and models in the analysis of display system performance, In Digital Images and Human Vision, A.B. Watson, edit. MIT Press: Cambridge, 163–178 1993.

C. Carlson, A simple psychophysical model for predicting the visibility of displayed information, Proceedings of the SID, 21, 229–245 1980.

Primary Examiner—Kevin J. Teska
Assistant Examiner—Matthew Loppnow
Attorney, Agent, or Firm—Kenneth L. Warsh

[57] ABSTRACT

A video display engineering and optimization CAD simulation system for designing a LCD display integrates models of a display device circuit, electro-optics, surface geometry, and physiological optics to model the system performance of a display. This CAD system permits system performance and design trade-offs to be evaluated without constructing a physical prototype of the device. The systems includes a series of modules which permit analysis of design trade-offs in terms of their visual impact on a viewer looking at a display.

4 Claims, 1 Drawing Sheet

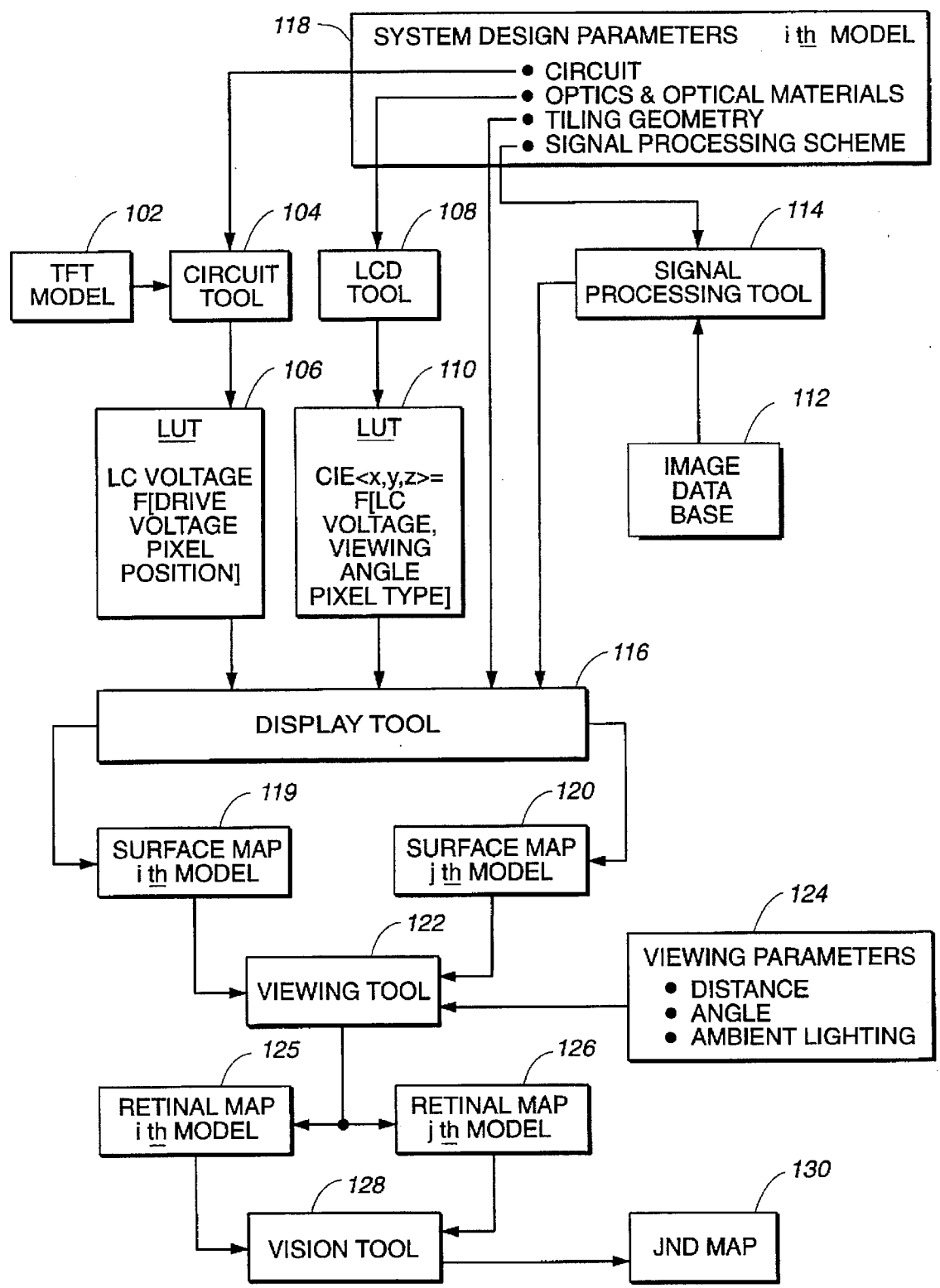
FIG._1

VIDEO DISPLAY ENGINEERING AND OPTIMIZATION SYSTEM

ORIGIN OF INVENTION

The invention described herein was made by an employee of the United States Government and may be manufactured and used by or for the Government for governmental purposes without payment of any royalties thereon or therefore.

BACKGROUND OF INVENTION

1. Technical Field Of The Invention

The present invention relates generally to computer-aided design (CAD) systems and, more particularly, to CAD systems and methods for designing visual displays.

2. Description Of The Prior Art

Electronic displays are used to convey information for a number of military, industrial, avionics, and consumer products. Traditional electronic displays use cathode ray tubes (CRTs). In comparison to the traditional cathode ray tube display, flat panel displays, such as liquid crystal displays (LCD's), provide compact, lightweight, relatively low-power, display units. Various other types of flat panel displays based on cold cathode or field emitters, vacuum florescent, and electroluminescent technologies are also used.

The various technologies used in flat panel display systems have implicit trade-off between cost and ease of manufacture. For a matrixed type of display such as an active matrix LCD (AMLCD), good gray scale resolution and good spatial resolution are obtained with increased manufacturing costs. Gray scale resolution and spatial resolution can be compromised and error diffusion techniques can be used to reduce the visibility of stair step artifacts which are a result of gray scale quantization. These various tradeoffs are often difficult to objectively evaluate and are often limited by the visual system of the evaluator. The ultimate criterion for judging the quality of a display resides in the human visual system, so that technology tradeoffs need to be evaluated in terms of the impact of tradeoffs on a system with a human viewer as an essential system component.

The traditional approach to design of a display system is often an iterative, cyclical process which requires an investment of a great deal of time and resources to cycle several times through the various design steps. For development of a product such as an electronic display, the design steps include: initial design, simulation of the design, construction of engineering prototypes, development of pilot production models, and assembly of final production models. Particularly in development of a product such as a display system, performance data is often developed at a later stage of the design process, which often may require that an earlier design step must be essentially, or at least in part, repeated. The traditional design cycle takes additional time to empirically go through the various design choices, particularly when the various design choices can only be verified with a working model.

Consequently, a need exists for a design tool, or simulator, which includes all of the various system elements for a display system and which allows a display system evaluator to be able to separately modify each element of the system. A need also exists for a display system design tool which provides objective performance measurements for comparison of a modified system design to a standard system design.

SUMMARY OF THE INVENTION

It is, therefore, an object of the present invention to provide a CAD design tool which incorporates the various system elements of a display system and which allows a display system evaluator to separately modify each system element in a simulated mode of operation.

It is another object of the invention to provide a display system design tool, or simulation system, which provides objective performance measurements for comparing an incrementally modifiable display system to a standard display system.

By reducing costs and reducing the design cycle time, such a simulation system is used to prune down the number of design choices early and inexpensively in the design cycle while still producing a high-quality display product. Such a simulation system is intended to provide first order, approximate results to narrow the range of choices and tradeoffs. Such a simulation system is not intended to entirely eliminate the construction of prototypes and physical characterization of displays.

Applications of a display simulation system according to the invention are for the design of control interfaces, such as avionics and automotive displays, computer system displays, telecommunication systems, data display systems, and entertainment systems. A display simulation system according to the invention supports a dialog between display designers/developers and system integrators with regard to tradeoffs between cost and performance. A display simulation system according to the invention greatly facilitates activities such as engineering trade-off studies based on evaluations of the visibility of artifacts such as fixed pattern noise, flicker, motion judder, etc. for specific test images and image sequences.

In accordance with this and other objects of the invention, a video display engineering and optimization system according to the invention provides a complete modeling system for designing and optimizing the various aspects of the design of a display system. One preferred embodiment of the invention is used for the design of a liquid crystal display (LCD) system. The video display engineering and optimization system includes a programmable computer with a number of discrete modules of software algorithms which are combined in a modular and extensible architecture. Using the video display engineering and optimization system according to the invention, it is possible to efficiently and accurately analyze design trade-offs in terms of their visual effect on a viewer looking at a display. The system integrates models of the circuit, electro-optics, surface geometry, and physiological optics to model the system performance of a display. System performance and design trade-offs are valuated without the need to construct a physical prototype of a display device. A display simulation system according to the invention greatly facilitates activities such as engineering trade-off studies based on evaluations of the visibility of artifacts such as fixed pattern noise, flicker, motion judder, etc. for specific test images and image sequences. Design trade-offs such as pixel geometry and pitch, liquid crystal cell gap, location and geometry of the thin film transistor TFT and storage capacitor can be quickly evaluated in terms of visual impact on a viewer.

A CAD system used for designing a liquid crystal display (LCD) device includes a display device model for a circuit simulation software package, which is capable of modeling complex semiconductor circuits. The circuit simulation software package provides data to a look-up-table (LUT) data structure which relates the drive voltage to the actual voltage provided to a pixel as a function of location in the display matrix. The drive signal waveform at the liquid crystal light valve can also be modeled, so that its effect on light valve transmissivity can also be modeled. The LUT data structure converts the drive signal at a pixel location, which is determined by the image signal and drive electronics, to the actual voltage at the pixel;

A system according to the invention includes an optical model of the light coming through the apertures of an LCD. This data can be stored as spectral power distributions or integrated with the CIE color matching functions to generate CIE Tri-Stimulus Values. The optical model is used to compute a LUT data structure whose entries are the CIE Tri-Stimulus Values, indexed as a function of pixel type, voltage applied to the pixel, and the direction of light propagation through the display device.

An image data base provides an image to be viewed. A signal processing tool is used to select, crop, and scale an image from the data base to provide a sampled image data structure, which includes a digital image sampled at the pixel density of the display, where each pixel corresponds to the drive voltage that is used to drive the corresponding pixel in the display;

A display tool is provided for constructing a surface map of the surface of the display device with an image written upon it. The surface map is a digital data structure where each location or pixel contains a triple, the CIE Tri-Stimulus values, corresponding to the modeled signal that would be obtained by a photometer with a small aperture measuring the display from a fixed direction, wherein the size of the aperture is determined by the "design rule" or the size of the smallest element used to create the surface map, wherein the input data to the display tool are the LUT computed by circuit tool, the LUT computed by LCD tool, the sampled image computed by the signal processing tool, and the pixel geometry (i.e. stripes, triads, quads, etc.) and mask structure which is defined by the user using this display tool.

A viewing model of the imaging and sampling of the image by a human eye is provided which includes means for specifying the viewing geometry and an optical modulation transfer function for the human eye. The optical modulation transfer function is used to filter the surface which is then down-sampled by a factor which corresponds to the sampling rate of the photo-receptor matrix on the retina or the imaging surface of the eye. The retinally sampled image is the output of the viewing tool.

A vision tool is provided which has the retinally sampled image as an input. The vision tool represents the human visual response. A just-noticeable-difference (JND) map of a local visibility index is provided for each point in a reference standard image and a corresponding retinally sampled image.

According to another aspect of the invention a CAD system used for designing a flat panel display device is provided. This system includes a display device model and a circuit simulation which is capable of modeling complex semiconductor circuits and which provides values to a look-up-table (LUT) data structure which relates drive voltage to pixel voltage as a function of location in the display matrix. An optical model of the light interacting with the display is used to compute a LUT data structure whose entries are the CIE Tri-Stimulus Values, indexed as a function of pixel type, of voltage applied to the pixel, and the direction of light propagation through the display device. A signal processing tool is used for selecting, cropping, and scaling an image from the data base to provide a sampled image data structure, which includes a digital image sampled at the pixel density of the display, where each pixel corresponds to the drive voltage that is used to drive the corresponding pixel in the display. A display tool is provided for constructing a surface map of the surface of the display device with an image written upon it, wherein the surface map is a digital data structure where each location or pixel contains a triple, the CIE Tri-Stimulus values, corresponding to the modeled signal that would be obtained by a photometer with a small aperture measuring the display from a fixed direction, wherein the size of the aperture is determined by the "design rule" or the size of the smallest element used to create the surface map. The input data to the display tool are the LUT computed by circuit tool, the LUT computed by LCD tool, the sampled image computed by the signal processing tool, and the pixel geometry (i.e. stripes, triads, quads, etc.) and mask structure which is defined by the user using display tool. A viewing model of the imaging and sampling of the image by a human eye includes means for specifying the viewing geometry and an optical modulation transfer function for the human eye, which is used to filter the surface which is then down-sampled by a factor which corresponds to the sampling rate of the photo-receptor matrix on the retina or the imaging surface of the eye, wherein the retinally sampled image is the output of the viewing tool. A vision tool has the retinally sampled image as an input, wherein the vision tool represents the human visual response. A just-noticeable-difference (JND) map of a local visibility index for each point in a reference standard image and a corresponding retinally sampled image.

A method of designing an LCD display is provided according to the invention, which includes the steps of: simulating the electrical characteristics of transistor devices used in an LCD display matrix; simulating the electrical circuitry of the LCD display; simulating light passing through an aperture in an LCD device in the LCD display; simulating the tiling geometry of the LCD display; processing an image to be displayed on the LCD display; constructing a surface map of the surface of the LCD display with an image written thereupon from output information obtained from modeling the electrical characteristics of the transistor devices used in an LCD display matrix. The method also includes the steps of simulating the imaging and sampling processes of the human eye by receiving the surface map of the surface of the LCD display and providing a retinally sampled image of the surface map of the surface of the LCD display; simulating human visual response to the retinally sampled image of the surface map of the surface of the LCD display; and comparing a reference standard image to a corresponding retinally sampled image.

The step of modeling the electrical circuitry of the LCD display includes providing values to a look-up-table (LUT) data structure which relates drive voltage to pixel voltage as a function of location in the display matrix and wherein the LUT data structure is used to convert the drive signal at a pixel location, which is determined by the image signal and drive electronics, to the actual voltage at the pixel. The step of simulating light passing through an aperture in an LCD device in the LCD display includes providing as an output a LUT data structure whose entries are the CIE Tri-Stimulus Values, indexed as a function of pixel type, voltage applied to the pixel, and the direction of light propagation through the display device.

The step of simulating the tiling geometry of the LCD display includes modeling a pixel geometry and a mask structure for the LCD device. The step of processing an image to be displayed on the LCD display includes selecting, cropping, and scaling an image from an image data base to provide a sampled image data structure, which includes a digital image sampled at the pixel density of the display, where each pixel corresponds to the drive voltage that is used to drive the corresponding pixel in the display. The step of constructing a surface map of the surface of the LCD display with an image written thereupon includes outputting a surface map which is a digital data structure where each location or pixel contains a triple, the CIE Tri-Stimulus values, corresponding to the modeled signal that would be obtained by a photometer with a small aperture measuring the display from a fixed direction, wherein the size of the aperture is determined by the "design rule" or the size of the smallest element used to create the surface map. The step of simulating the imaging and sampling processes of the human eye includes specifying the viewing geometry and an optical modulation transfer function for the human eye, which is used to filter the surface which is then down-sampled by a factor which corresponds to the sampling rate of the photo-receptor matrix on the retina or the imaging surface of the eye. The step of comparing the reference standard image to a corresponding retinally sampled image includes providing a just-noticeable-difference (JND) map of a local visibility index for each point in a reference standard image and a corresponding retinally sampled image. A method is also provided for designing a flat panel display.

BRIEF DESCRIPTION OF THE DRAWING

The accompanying drawing which are incorporated in and form a part of this specification, illustrate embodiments of the invention and, together with the description, serve to explain the principles of the invention:

FIG. 1 shows a system block diagram for a CAD simulation system for design of display devices.

DETAILED DESCRIPTION OF THE INVENTION

Reference will now be made in detail to the preferred embodiments of the invention, examples of which are illustrated in the accompanying drawing. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIG. 1 illustrates a block diagram for a CAD system 100 which is used to simulate and optimize design display devices. A number of flat panel display device types can be modeled and optimized with this type of simulation system. The exemplary CAD system 100 is composed of a number of modules for optimization of LCD displays.

A module 102 provides models of display devices and is used to simulate the individual circuit components of, for example, an active matrix liquid crystal display (AMLCD). An AMLCD includes an array, or matrix, of monolithic semiconductor devices provided as thin film transistors (TFT) on transparent substrates such as plastic, quartz, or glass. Display device models have been developed for amorphous silicon and for poly silicon TFTs as disclosed in an article by M. Shur, M. Hack, and A. Y. Byun entitled "Circuit models and parameter extraction technique for poly-Si Thin Film Transistors, Proc." 1993 Intl. Semiconductor Device Res. Symp., Charlottesville, Va., 1, pps. 165–168 and as disclosed in a book by M. Shur entitled *Physics of Semiconductor Devices*, Prentice-Hall, 1990.

A circuit simulation module 104 is a software package which is capable of modeling and simulating the performance of complex semiconductor circuits such as, for example, the TFT semiconductor display devices from module 102. The models of the display devices from the module 102 are incorporated into the circuit simulation module 104. For each TFT device, the circuit simulation module 104 provides a look-up table (LUT) 106 which relates the drive voltage on a TFT device to the actual pixel voltage as a function of location of the TFT device in the TFT display matrix. The LUT 106 data structure converts the drive signal at a pixel location, which is determined by an image signal and drive electronics, to the actual voltage at the pixel. A pixel is defined as the smallest element of a display space that can be independently assigned color and intensity.

An LCD performance model 108 provides an optical model for light passing through the apertures of the LCDs. The LCD model 108 is used to compute the values of a LUT data structure 110. The values of the LUT data structure 110 are CIE Tri-Stimulus values, which are indexed as a function of pixel type, the voltage applied to a pixel, and the direction of light propagation. The LCD performance model is based upon Berreman's solution to the liquid crystal optics modeling problem as disclosed in D. W. Berreman's article entitled "Numerical Modeling of Twisted Nematic Devices" Phil. Trans. R. Soc. Lond, 309 (1983), 203–216 and in an article by D. W. Berreman and T. J. Scheffer entitled "Reflection and Transmission by Single-Domain Cholestric Liquid Crystal Films: Theory and Verification" (1970) Mol. Crystals and Liquid Crystals, 11, 395–405.

The LUT 110 values depend upon a complete characterization of the optical stack forming the LCD device, including the materials properties of the layers, dielectric constants, viscosity, birefringence, orientation of the polarizers, alignment layers, etc. The calculation to obtain the values is done in two parts. First, a liquid crystal director configuration is determined for the electric field applied to the stack. Next, parameters are extracted from the optical stack and are used in Maxwell's equations, which describe the transmission of light through the stack. The equations are numerically evaluated to determine the transmitted and reflected light for each of a finite number of wavelengths and directions. The calculation is based upon a model of the power spectral density of the backlight, which is attenuated by a model of the directional intensity of the light source, and the computed spectral transmission of the LCD. The power spectrum of the transmitted light is then converted to CIE Tri-Stimulus values which are sufficient for later stages of modeling. Changing the optical stack forming the LCD device or changing any of the parameters either of the individual layers or of the backlight results in a change in the LUT 110 values.

An image data base 112 contains an image that is an analytic function such as, for example, any periodic function of two variables. The image can be an object oriented graphic. The image can be a digital image such as an electronically scanned natural image. The image could also be obtained from a signal that is dynamically transmitted in a standard format such as a NTSC format or a PAL format or any digital format such as MPEG & JPEG. To be displayed on a LCD, that signal is decoded and stored in a digital format in a frame store in the image date base 112 or decoded and sampled in 114. The user interface for the CAD system 100 supports a user in selecting, cropping, and scaling an image from the image data base 112.

A signal processing module 114 provides additional decoding, filtering, and sampling. An image may have originated in a digital format or in some other format. In either case, an image selected from the image data base 112 is processed to simulate the transformations that have occurred to put it into a digital format. This is modeled as filtering and sampling of the data base image. The image may be further filtered and sampled as it is written to the display device by the device's addressing subsystems. This further filtering and sampling is with a signal processing module 114. This module supports elementary filtering and sampling schemes, but arbitrarily complex processing can be modeled by the user creating and inserting an appropriate filtering and sampling routine at this point. For example, an error diffusion dithering scheme can be modeled in this module.

The values for a sampled image data structure are produced by the signal processing module 114. The sampled image data structure is a digital image sampled at the pixel density of the LCD display being modeled. Each pixel corresponds to the drive voltage that is used to drive the corresponding pixel in the LCD display.

A Display Tool module 116 constructs an "i" surface map 119 of the surface of the display device with an $i^{th}$ image written upon it. Similarly, the Display Tool module 116 also constructs a "j" surface map 120 of the surface of the display device with a $j^{th}$ image written upon it. The $i^{th}$ and $j^{th}$ images modeled are usually identical. Some design parameter of the display system such as, for example, pixel geometry, color filter specification, cell gap, TFT design or processing, stepper accuracy, dithering scheme, drive scheme, drive signal waveform shaping, etc., is varied so that the comparison reflects a difference between one or more design options.

User inputs of various display system parameters for the modules 102, 104, 108, 114, 116 are provided from, for example, a graphical user interface (GUI) module 118. The parameters include device design parameters, display matrix parameters, optic parameters, optical material parameters, tiling geometry parameters, signal processing parameters.

The surface maps 119, 120 provided by the display tool module 116 are digital data structures. Each location or pixel of a surface map contains a triple which comprises the CIE Tri-Stimulus values which correspond to the modeled signal that would be obtained by a photometer with a small aperture measuring the LCD display from a fixed direction. The size of the aperture is determined by the "design rule" or the size of the smallest element used to create the surface map. The process that computes a surface map is described, for example, in an article by R. Samadani, J. Lanham, D. Loomis, L. Silverstein, and J. Larimer entitled "Color tilings for flat-panel displays." (1993) SID'93 Digest, 893–96.

The input data to the module 116 that computes the surface maps 119, 120 are the values of the LUT 106 computed by the circuit simulation module 104, the values of the LUT 110 computed by the LCD model 108, the sampled image computed by the signal processing module 114, as well as the pixel geometry (i.e. stripes, triads, quads, etc.) and mask structure which is defined by the user using Display Tool module 116. The Display Tool module 116 tessellates the surface map by finding the CIE Tri-Stimulus values for each location in the surface map by indexing the appropriate LUTs 106, 110 and pixelated image data structure.

A surface map can be created for the light transmitted through an LCD device from the backlight. A second surface map can be created from the ambient light reflected off of the front surface of the LCD device. The second surface map is computed using a LUT constructed by LCD Tool module 108 using a reversed optical stack and a model of the ambient light source. Since these two surface maps represent the light transmitted from the rear of the LCD device and the light reflected from the front of the LCD device as measured by a photometer, the final surface map 106 for the $i^{th}$ device is computed by vector addition of the Tri-Stimulus values of these two maps pixel-by-pixel. The vector addition is equivalent to physical superposition of the Tri-Stimulus values of these two maps location by location. A surface map representing a second, $j^{th}$, display can be computed by repeating these steps. A surface map is a complete physical model of the LCD device with an image in ambient illumination. By varying any parameter of the model, a second surface map can be constructed to evaluate the trade-offs implied by changing that parameter.

A viewing tool model 122 simulates the imaging and image sampling functions of the human eye. The viewing model 122 computes the human visual response to the surface model. User inputs of various viewing parameters for the module viewing tool module 122 are provided from, for example, another graphical user interface (GUI) module 124 which provides viewing parameters such as, for example, distance, angle, and ambient lighting.

There are two parts to the viewing model 122. First, the viewing geometry must be specified. This is done by specifying the viewing distance of the observer from the LCD display and by specifying the surface tilt relative to the line of sight of the observer. Secondly, the optical modulation transfer function for the human eye [6] is used to filter the surface map, which is then down-sampled by a factor which corresponds to the sampling rate of the photo-receptor matrix on the retina, or imaging surface of the eye. Retinal maps 125, 126 are then provided as sampled images and becomes the inputs to a vision tool model 128 of human vision. An article by F. W. Campbell and R. W. Gubisch entitled "Optical quality of the human eye". J. Physiol. (Lond.)186, (1966) 558–578 discusses the optical modulation transfer function and the point spread function of the eye.

The human vision model 128 represents the human visual response as a set of cascaded, spatially local, oriented, band pass, and low pass filters which are used to generate contrast signals. The contrast signals are transformed by a point non-linearity which corresponds to signal compression in neurons and a gain transformation where filter energies are scaled by a weighted sum of energies in nearby filters in orientation and spatial frequency parameter space. Thus the surface map, for a selected region of the surface and viewing geometry, is converted into a n-dimensional representation of the human visual system's responses to each location in the retinally sampled image. These local responses are n-tupels, where each scalar value corresponds to the signal in one of the model's n putative mechanisms of the human vision. The architecture for the chromatic models and temporal models are similar. In the case of temporal modeling the filters are tuned in the spatial-temporal domain. In the case of the chromatic model, the power spectra are converted to cone signals which are recombined to form the inputs to the chromatic pathways. Spatial sampling is represented in the spatial frequency domain.

The human vision model is similar in architecture to models proposed by: H. R. Wilson, J. R. Bergen (1979) in "A four mechanism model for threshold spatial vision." Vis. Res., 19, 19–32; J. Larimer, M. Prevost, A. Arditi, S. Azueta, J. Bergen, J. Lubin (1991) Proceedings of the SPIE, 1456, 196–210; J. Lubin, J. Bergen (1993) In "Cockpit Display Visibility Modeling," NASA Contractor Report 1777623; and J. Lubin (1993) in "The use of psycho-physical data and models in the analysis of display system performance," In Digital Images and Human Vision, A. B. Watson, edit. MIT Press, Cambridge, 163–178.

There are, of course, individual differences among observers with respect to important dimensions of vision such as spatial and temporal acuity. Chromatic differences due to aging and pigmentation are well known and documented. Just as the CIE established a standard observer for color matching, it is also possible to develop a standard observer for the spatial and temporal aspects of human vision.

The ultimate performance criterion for any display is how good images reconstructed on it look to an observer. Unfortunately, two normal observers can look at the same image and differ widely in their opinions as to the "quality" or "goodness" of the image and or the device upon which the image is displayed. On the other hand, visual psychophysical research employing normal observers has shown remarkable consistency with respect to the discriminability of visual differences between images across observers. This ability to discriminate is generally independent of the viewer's subjective impressions of the images.

A JND map 130 provides a tool for a measure of visibility using a "Just Noticeable Difference" (JND). This metric is logically similar to the JND model of visibility proposed by C. Carlson, Cohen, R. (1980) in "A simple psychophysical model for predicting the visibility of displayed information." Proceedings of the SID, 21, 229–245.

Given two surface maps that correspond to the same modeled device viewed at different tilts but at the same distance or different modeled devices of the same size and with the same image displayed, a local visibility index is computed for each point in the corresponding retinally sampled images.

A surface map can be created to serve as a standard. For example, the standard could be text on a high resolution LCD display. The pixel pitch of the standard LCD display might be very difficult or impossible to manufacture, but if it could be manufactured it would be an ideal display. This display can be modeled even though it may not be possible to build it. Use of the JND metric allows performance provided by this standard to be compared to the performance obtained from other displays. These other displays may have lower resolution or other cost saving features which allow them to be more readily manufactured at a market-competitive price. This approach to image quality changes the question from that of what is a good display to that of how discriminable is a particular display from the standard. The issue of image quality then becomes a problem of selecting standards.

The JND visibility metric allows predictions of when differences can be seen and where in the rendered images on the modeled displays the difference(s) will be visible. Although this model does not predict which device will be "best", it does support comparisons of alternatives. So, for example, it is possible to decide if increasing the pixel pitch from 300 dots per inch to 400 dots per inch for two gray scale devices will result in a noticeable difference. If the added resolution cannot be seen, then clearly the cheaper device to manufacture, all other aspects being equal, is the "best". Since the concept of an "absolute best" is a concept upon which normal observers can differ, usually based upon subjective and possibly cognitive factors, we believe that the JND metric approach is more useful to the display designer and systems integrator. By selecting a standard to serve as a benchmark, image quality is measured in terms of the number of JNDs that separate a particular display from the benchmark.

A simulation system according to the invention provides simulation of various visual effects including, but not limited to, pixel mosaic visibility, resolution, interlacing, signal processing, color gamut, contrast, viewing distance, viewing angle, diffuse ambient lighting, specular reflections, full field flicker, spatial jaggies, luminance banding, quantization noise, grayscale, motion clutter, motion jaggies, color jaggies, spatial-temporal-chromatic interactions, and letter legibility.

Examples of analyses supported by a simulation system according to the invention include grayscale vs. spatial resolution, non-uniform color separation pitch, and pixel geometry and tiling rules.

The simulation-based CAD tool according to the invention also supports mixed mode modeling for materials or display elements for which computational models are slow, not well developed, or even unavailable. One or more of the LUTs can have information which is obtained empirically, outside of this system, and inserted into the modeling stream of the system. The architecture of the system permits this type of operation. For example, with empirical measurements of the light emission from a FED (field emission device) pixel structure can be used instead of a computational model of the electron optics and phosphor emission process. Other examples include empirical measurements for small aperture diffraction and inhomogeneous light valves. In these cases, modeling is difficult; but it is possible to build test structures that can be measured so that normative characterizations can be used to construct LUTs for system simulation and design evaluation.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A computer-implemented CAD system for engineering and optimization of a LCD display, comprising:

a device model of the electrical characteristics of a transistor device which forms the pixels of an LCD device in an LCD display matrix;

a circuit model of the electrical circuitry of the LCD display matrix, said circuit model providing values to a look-up-table (LUT) data structure which relates drive voltage as a function of pixel location in said display matrix and wherein the LUT data structure converts a drive signal at a pixel location, which is determined by the image signal and drive electronics, to an actual voltage at the pixel;

a light model of the LCD device, which models light passing through an aperture in an LCD device in the LCD display matrix, wherein the light model provides said LUT data structure whose entries are CIE Tri-Stimulus Values, indexed as a function of pixel type, voltage applied to the pixel, and the direction of light propagation through the LCD display matrix;

a tiling model of the pixel shapes and tiling geometry of an LCD display matrix, said tiling model including a user-defined model of pixel shape and tiling geometry;

a signal processor providing an output image to be displayed on the LCD display matrix, said signal processor providing a sampled image data structure, which includes a digital image sampled at the pixel density of the display matrix, where each element of the digital image corresponds to the drive voltage that is used to drive the corresponding pixel in the display;

a display tool which constructs a surface map of the surface of the LCD display matrix with an image written thereupon from output information obtained from the device model, the circuit model, the light model, the tiling model and the signal processor, said display tool generating a surface map which is a digital data structure where each pixel location contains a triple of the CIE Tri-Stimulus values that would be obtained by a photometer with a small aperture measuring the display matrix from a fixed direction;

a viewing model of the imaging and sampling processes of the human eye, said viewing model receiving the surface map of the surface of the LCD display matrix, said viewing model of the imaging and sampling processes of the human eye including means for specifying the viewing geometry and an optical modulation transfer function for the human eye, which is used to filter the surface map of the display tool, which is then down-sampled by a factor which corresponds to the sampling rate of the photo-receptor matrix on the retina and other imaging surface of the eye;

a vision model of human visual response which receives the retinally sampled image of the surface map of the surface of the LCD display matrix and which provides an output image modified by the human visual response of the vision model and;

a comparator which compares a first output image from the vision model to a second output image from the vision model, said comparator providing a just-noticeable-difference (JND) map of a local visibility index for each point in a first reference image from the vision model and a second image from the vision model.

2. A CAD system used for designing a flat panel display device, comprising:

a model of a pixel device;

a circuit simulator which models a display circuit formed of an array of pixel devices and which provides values to a look-up-table (LUT) data structure which relates drive voltage to pixel voltage as a function of location in the array, wherein the LUT data structure is used to convert the drive signal at a pixel location, which is determined by an image signal and drive electronics, to the actual voltage at the pixel;

an optical model of light interacting with a pixel device, wherein the optical model is used to compute a LUT data structure whose entries are the CIE Tri-Stimulus Values, indexed as a function of pixel type, voltage applied to the pixel, and the direction of light propagation through the display device;

an image data base;

a signal processing tool which processes a sampled image data structure from the image data base and which provides a digital image sampled at the pixel density of the display;

a display tool for constructing a surface map of the surface of a flat panel display device with an image written upon it, wherein the surface map is a digital data structure where each location or pixel contains a triple, the CIE Tri-Stimulus values, corresponding to a modeled signal that would be obtained by a photometer with a small aperture measuring the display from a fixed direction, wherein the input data to the display tool are provided from LUTs generated by the circuit simulator, the optical model, the signal processing tool, and a tiling model of pixel shapes and tiling geometry of the flat panel display device;

a viewing model of the imaging and sampling of the image by a human eye, including means for specifying the viewing geometry and an optical modulation transfer function for the human eye, which is used to filter the surface which is then down-sampled by a factor which corresponds to the sampling rate of the photo-receptor matrix on the retina or the imaging surface of the eye, wherein the retinally sampled image is the output of the viewing tool;

a vision tool having the retinally sampled image as an input, wherein the vision tool represents the human visual response; and a comparator which compares a first output image from the vision model to a second output image from the vision model, said comparator providing a just-noticeable-difference (JND) map of a local visibility index for each point in a first reference image from the vision model and a second image from the vision model.

3. A computer-implemented method of designing an LCD display, comprising the steps of:

simulating the electrical characteristics of transistor devices for the pixels of an LCD display matrix;

simulating the electrical circuitry of the LCD display matrix, wherein the step of simulating the electrical circuitry of the LCD display matrix includes generating values for a look-up-table (LUT) data structure which relate drive voltage to pixel voltage as a function of location in the display matrix and the image signal;

simulating light passing through an aperture in an LCD device in the LCD display matrix, wherein the step of simulating light passing through an aperture in an LCD device in the LCD display matrix includes providing as an output said LUT data structure whose entries are CIE Tri-Stimulus Values which are indexed as a function of pixel type, voltage applied to the pixel, and the direction of light propagation through the display device;

simulating the pixel shapes and tiling geometry of the LCD display matrix, wherein the step of simulating the pixel shapes and tiling geometry of the LCD display matrix includes modeling a mask structure for the LCD device display matrix;

processing an image to be displayed on the LCD display matrix, wherein the step of processing an image to be displayed on the LCD display includes selecting, cropping, and scaling an image from an image data base to provide a sampled at the pixel density of the display, where each pixel corresponds to the drive voltage that is used to drive a corresponding pixel in the LCD display matrix;

constructing a surface map of the surface of the surface of the LCD display matrix with an image written thereupon from output information obtained from simulation of the electrical characteristics of the transistor devices used in an LCD display matrix, from simulation of the circuitry of an LCD display; from simulation light passing through an aperture in an LCD device in the LCD display; from for simulation the pixel shapes and tiling geometry of the LCD display; and from the processing of an image to be displayed on the LCD display, wherein the step of constructing a surface map of the surface of the LCD display with an image written thereupon includes outputting a surface map which is a digital data structure where each location or pixel contains a triple of the CIE Tri-Stimulus values corresponding to the modeled signal that would be obtained by a photometer with a small aperture measuring the display from a fixed direction;

simulating the imaging and sampling processes of the human eye by receiving the surface map of the surface map of the surface of the LCD display matrix and providing a retinally sampled image of the surface map of the surface of the LCD display matrix;

simulating human visual response to the retinally sampled image of the surface map of the surface of the LCD display matrix, wherein the step of simulating the imaging and sampling processes of the human eye includes specifying the viewing geometry and an optical modulation transfer function for the human eye, which is used to filter the surface map which is then down-sampled by a factor which corresponds to the sampling rate of the photo-receptor matrix on the retina or the imaging surface of the eye; and comparing a reference standard image to a corresponding retinally sampled image, wherein the step of comparing the reference standard image to a corresponding retinally sampled image includes generating a just-noticeable-difference (JND) map of a local visibility index for each point in a reference standard image and a corresponding retinally sampled image.

4. A method of designing a flat panel display device, comprising the steps of:

modeling a pixel device;

simulating a display circuit formed of pixel devices and generating a look-up-table (LUT) data structure which relates drive voltage to pixel voltage as a function of location in the display, wherein the LUT data structure is used to convert the drive signal at a pixel location, which is determined by the image signal and drive electronics, to the actual voltage at the pixel;

optically modeling the light interacting with a pixel device and computing a LUT data structure whose entries are CIE Tri-Stimulus Values indexed as a function of pixel type of voltage applied to the pixel and the direction of light interacting with the LCD display device;

providing an image data base;

processing an image from the image data base to provide a sampled image data structure, which includes a digital image sampled at the pixel density of the display, where each pixel corresponds to the drive voltage that is used to drive the corresponding pixel in the display;

constructing a surface map of the surface of the display device with an image written upon it, wherein the surface map is a digital data structure where each location or pixel contains a triple, the CIE Tri-Stimulus values, corresponding to the modeled signal that would be obtained by a photometer with a small aperture measuring the display from a fixed direction, wherein the input data to the display tool are provided by simulating the display circuit, optically modeling the light, and processing the image from the image data base;

simulating a viewing model of the imaging and sampling of the image by a human eye, including specifying the viewing geometry and an optical modulation transfer function for the human eye, which is used to filter the surface which is then down-sampled by a factor which corresponds to the sampling rate of the photoreceptor matrix on the retina or the imaging surface of the eye, and providing the retinally sampled image as an output;

simulating human visual response of a retinally sampled input image; and comparing a reference standard image to a corresponding retinally sampled image, wherein the step of comparing a reference standard image to a corresponding retinally sampled image including generating a just-noticeable-difference (JND) map of a local visibility index for each point in a reference standard image and a corresponding retinally sampled image.

* * * * *